United States Patent [19]

Woodward et al.

[11] 3,745,509

[45] July 10, 1973

[54] HIGH DENSITY ELECTRICAL CONNECTOR

[75] Inventors: Stephen Guild Woodward, Cheshire; John Phillip Treschitta, Norwalk, both of Conn.

[73] Assignee: The Bunker-Ramo Corporation, Oak Brook, Ill.

[22] Filed: Mar. 2, 1971

[21] Appl. No.: 120,077

[52] U.S. Cl. ......... 339/14 R, 317/101 D, 339/17 F, 339/17 M, 339/75 MP, 339/176 MF, 339/214 R

[51] Int. Cl. ......................... H01r 13/54, H05k 1/02

[58] Field of Search .............. 317/101 CC, 101 CM, 317/101 D, 101 DH; 339/17 R, 17 F, 17 L, 17 LM, 17 M, 18 R, 18 C, 18 P, 19, 75 MP, 176 MF, 176 MP, 174, 119, 125, 14, 192, 103, 107, 59 R, 59 M

[56] References Cited

UNITED STATES PATENTS

| | | | |
|---|---|---|---|
| 3,288,915 | 11/1966 | Hatfield et al. | 339/18 R X |
| 3,654,585 | 4/1972 | Wickersham | 339/151 B X |
| 3,218,604 | 11/1965 | Reimer | 339/17 F X |
| 3,221,286 | 11/1965 | Fedde | 339/17 |
| 3,240,885 | 3/1966 | Grunfelder et al. | 339/18 C X |
| 3,356,983 | 12/1967 | Johnson, Jr. | 339/17 M X |
| 3,541,222 | 11/1970 | Parks et al. | 174/68.5 |
| 3,499,219 | 3/1970 | Griff et al. | 174/68.5 X |

*Primary Examiner*—Joseph H. McGlynn
*Assistant Examiner*—Terrell P. Lewis
*Attorney*—Frederick M. Arbuckle

[57] ABSTRACT

A device for connecting a high-density multi-conductor line to an element having electrically conducting portions. Each signal conductor of the line is electrically connected to a conducting segment of an inter-connecting wafer formed of conducting material, the segments being electrically isolated from each other and from the conducting material of the wafer by dielectric material. The other end of each segment passes through the wafer and contacts a malleable portion secured to a conducting island of an electrically conducting connecting wafer. The islands are electrically isolated from the conducting material of the wafer and from each other by dielectric material. The wafers are secured together and mounted in a housing which preferably also contains a pressure pad. For preferred embodiments, the ground conductor of the line is secured to the conducting material of the inter-connecting wafer with malleable portions being secured to the conductive material of the connecting wafer to carry the ground level to this wafer. Malleable portions are also provided on the underside of each island and on the underside of the conducting material of the connecting wafer. The conducting portions of the element are brought into contact under pressure with these portions to complete a connection.

33 Claims, 15 Drawing Figures

PATENTED JUL 10 1973

3,745,509

INVENTORS.
Stephen Guild Woodward
John Phillip Treschitta
BY
Ronald J. Kransdorf
ATTORNEY.

INVENTORS.
Stephen Guild Woodward
BY John Phillip Treschitta

ATTORNEY.

INVENTORS.
Stephen Guild Woodward
BY John Phillip Treschitta

ATTORNEY

INVENTORS.
Stephen Guild Woodward
BY John Phillip Treschitta
ATTORNEY.

INVENTORS.
Stephen Guild Woodward
BY John Phillip Treschitta

ATTORNEY.

HIGH DENSITY ELECTRICAL CONNECTOR

This invention relates to a device for connecting a high-density, multi-conductor line to an element having electrically conducting portions such as another multi-conductor line, or a circuit board; and more particularly to a connecting device of the type indicated which maintains maximum shielding and good impedance match through the connector.

Tape cables, striplines, and multi-conductor, semi-rigid coaxial cables are now available in high-density configurations which pack from 20 to 100 conductors to the inch. In a typical application, the center-to-center spacing between conductors of the cable are 0.025 inches, but this spacing may be as little as 0.01 inches. At this time, connectors for securing two such lines together, or for securing such a line to a circuit board or other element, are not readily available. Such connectors as are available are complicated and expensive. Another problem with these connectors is that they generally carry separate ground and signal wires through the connector, thus losing the ground plane shielding between conductors. The resulting crosstalk potential between conductors introduces a noise problem into circuits utilizing the connectors which, among other things, restricts the signal bandwidth which the lines can carry. In applications where high bandwidth requirements must be maintained, expensive equalizers and other compensating hardware must be utilized to overcome the noise problem. Existing connectors also have a geometry which differs significantly from that of the elements being connected and it is thus difficult to achieve good impedance matches in these connectors. Resulting impedance mismatches cause reflections in the circuit. These reflections, in addition to introducing energy losses into the circuit, also cause troublesome standing waves.

A need thus exists for a relatively simple and inexpensive device for connecting high-density, multi-conductor lines to each other or to other circuit elements. Such a device should permit maximum shielding to be maintained between the conductors through the connector and should not introduce an impedance mismatch into the circuit.

It is therefore a primary object of this invention to provide an improved connector for use with high density multi-conductor lines.

A more specific object of this invention is to provide a relatively simple and inexpensive connector for use with such high density multi-conductor lines.

A still more specific object of this invention is to provide a connector of the type indicated above which has ground-plane shielding between the conductors throughout the connector so as to substantially eliminate noise inducing cross-talk.

Still another object of this invention is to provide a connector of the type indicated above, the geometry of which is sufficiently similar to that of the elements being connected so that impedance matches may be maintained through the connector.

In accordance with these objects this invention provides a device for physically and electrically connecting a high-density, multi-conductor electrical line to an element having electrically conductive portions. The device includes a connecting wafer of electrically conductive material which has an upper and a lower surface. A plurality of dielectric filled openings extend between the surfaces with an island of electrically conductive material being positioned in each of the openings and projecting slightly from each of the surfaces. The islands are electrically isolated from the conducting material of the wafer and from each other by the dielectric material. There is at least one opening and thus conductive island, for each of at least selected ones of the conductors of the line. The selected ones of the conductors are the signal conductors, as opposed to the ground conductors, of the line. For preferred embodiments of the invention a portion of malleable electrically conductive material is secured in electrical contact with each surface of each of the islands, forming the projecting portions of the islands, and the connector also includes an inter-connecting wafer of electrically conductive material having a predetermined pattern of electrically conductive segments formed thereon. There is a segment on the wafer for each of the signal conductors with the segments being electrically isolated from each other and from the conducting material of the wafer by dielectric material. Each of the segments has a first and a second end with the first ends extending through the wafer at one end. A means is provided for physically and electrically connecting the signal conductors of the line to corresponding segments at the second end of the segments. Means are also provided for supporting the wafers in a position with each of the ends of the segments which extend through the inter-connect wafer in electrical contact with a malleable portion on one of the surfaces of the connecting wafer. Finally, a means is provided for securing the wafers under pressure to the element to which the line is to be connected with the malleable portions on the other surface of the wafer in electrical contact with conductive portions of the element. For preferred embodiments of the invention, the line also includes at least one ground conductor and the device includes a means for electrically connecting the ground conductor to the conductive materials of the connecting wafer.

The foregoing and other objects, features and advantages of the invention will be apparent from the following more particular description of preferred embodiments of the invention as illustrated in the accompanying drawings.

Figure 1:
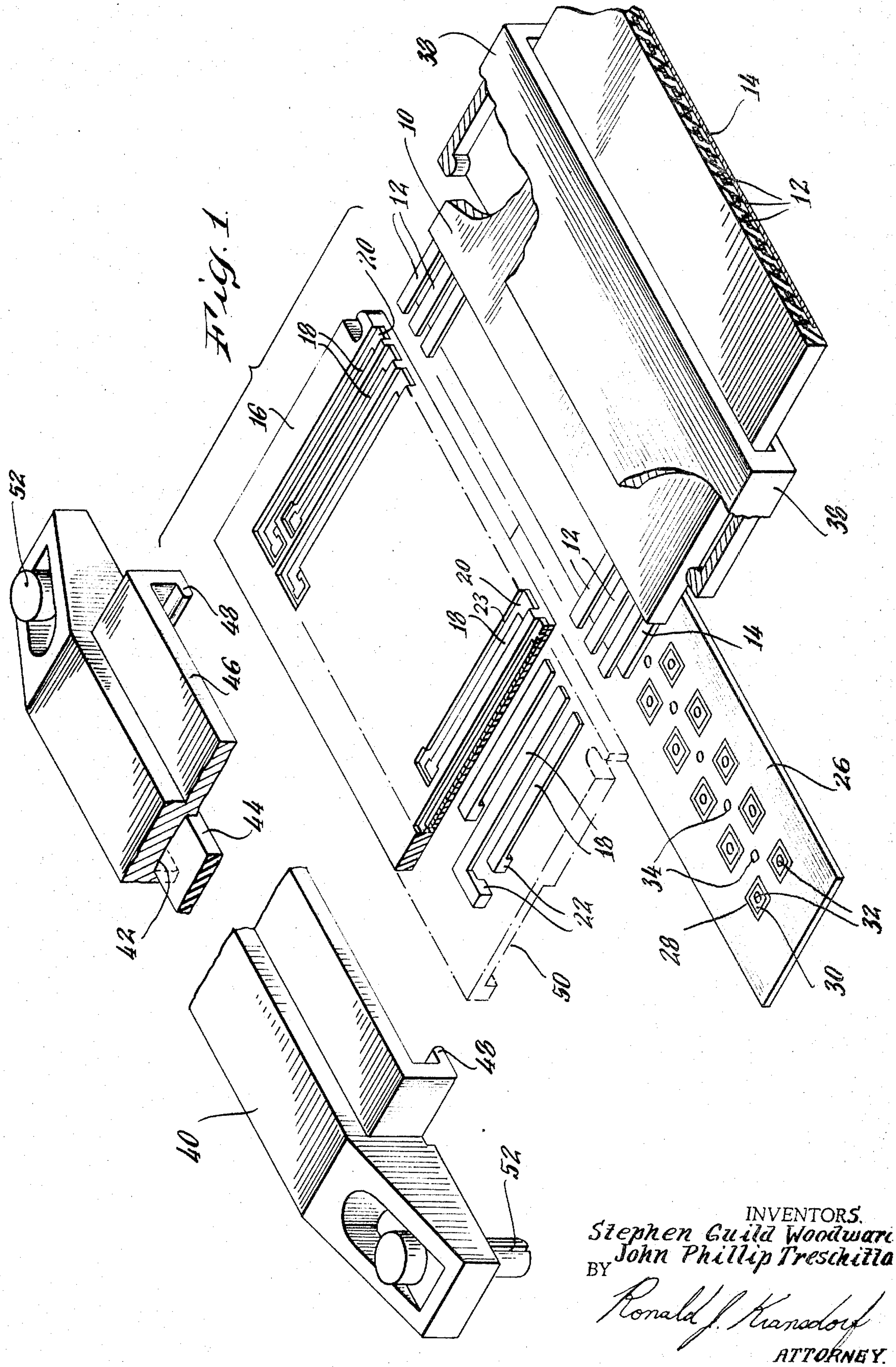
FIG. 1 is an exploded, partially cut-away perspective view of a preferred embodiment of the invention.
Figure 2:
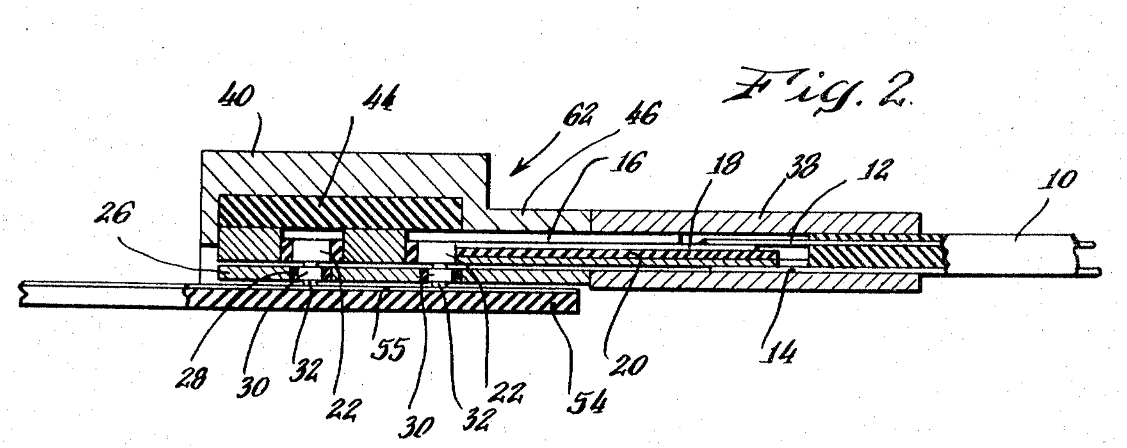
FIG. 2 is an assembled side view of the connector of the embodiment of the invention of FIG. 1 shown mounted on a circuit board.
Figure 4:
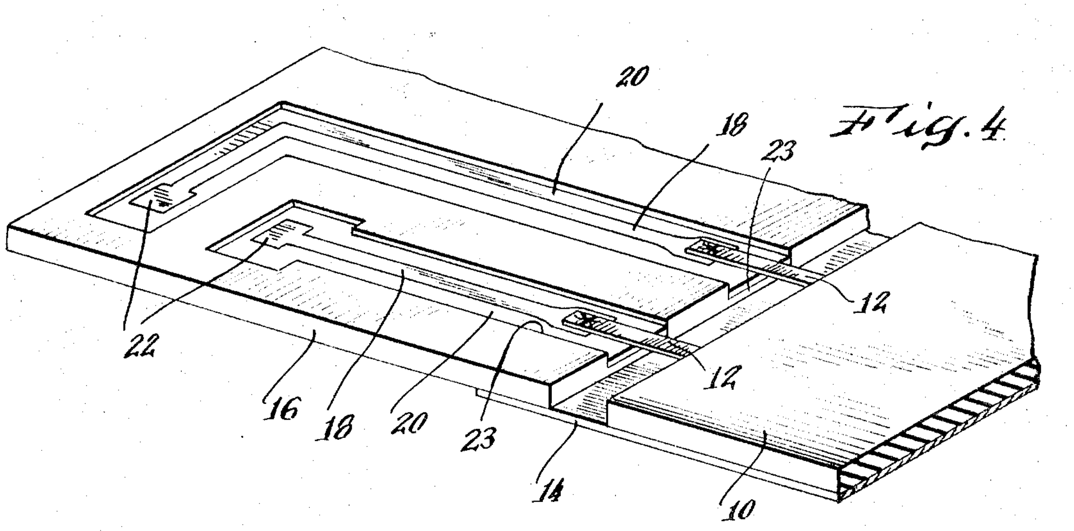
FIGS. 4, 5 and 6 are detailed perspective views of the signal and ground line connections between a cable and an inter-connect wafer for various types of lines.

Referring now to FIGS. 1 and 2, it is seen that a tape cable 10 having a plurality of signal conductors or leads 12 and a common ground conductor 14 is secured to a conductor grid or inter-connect wafer 16. The inter-connect wafer, which may be best seen in FIGS. 1 and 4, is a wafer of conductive material which has a plurality of segments of conductive material 18 formed therein. Each of the segments 18 is isolated physically and electrically from the conductive material of the wafer 16 and from the other segments by dielectric material 20. Wafers of the type described above are shown and described in greater detail in copending application Ser. No. 49873 filed on June 25, 1970 on behalf of Howard L. Parks, entitled "Electrical Circuit Packaging Structure and Method of Fabrication Thereof" and assigned to the assignee of the instant application. A method for manufacturing wafers of this type is also described in the Parks application. The segments 18 are, at one end of wafer 16, parallel to each other with a center-to-center spacing which is equal to the center-to-center spacing of the cable conductors 12. As indicated previously, this spacing might vary from 0.05 inches to 0.01 inches in typical applications.

Since the center-to-center spacing for the element which is being connected to would normally differ from that of the cable end, the segments 18 are arranged in a pattern at the far end with a desired configuration. Each segment 18 terminates at its far end in a conductive portion 22 which extends through to the underside of the wafer. As described more fully in the before mentioned Parks application, the electrical isolation provided by dielectric material 20, exist for the Z-axis portion 22 of the segment as well as for the remainder of the segment. For reasons which will be mentioned later, each of the segments 18 are positioned in a trough 23 formed in the wafer.

Figure 3A:
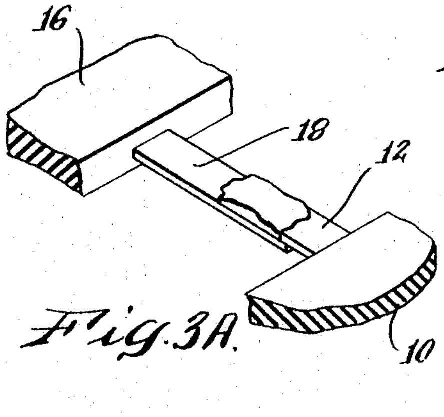
FIGS. 3A–3C illustrate three different ways in which cable conductors may be secured to inter-connect wafer segments in the various embodiments of the invention.
Figure 3B:
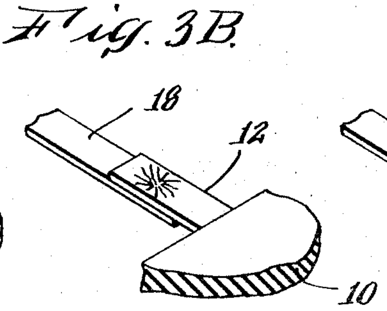
Figure 3C:
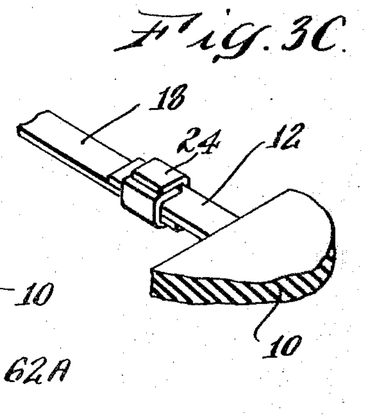

In FIG. 4, each conductor 12 is shown as being spot welded to a corresponding conductive segment 18 with ground plane 14 being similarly spot welded to the conductive material on the underside of wafer 16. From FIGS. 3A-3C, it is seen that in addition to the spot welding technique shown in FIG. 3B, or other similar thermal bonding methods, a re-flow solder (for example tin and induction solder) joint could be utilized to secure the conductors (FIG. 3A) or a mechanical crimp or clamp 24 could be utilized to secure the elements together. Standard well-known techniques could be utilized for making the selected joint.

Referring again to FIGS. 1 and 2, it is seen that a second wafer, a connecting wafer 26, is fastened or bolted to the underside of wafer 16. Connecting wafer 26 is also formed of a conductive material and has a plurality of openings formed therein, each of which is filled by dielectric material 28. Positioned in the center of the dielectric material of each opening is an island of conductive material 30 with a portion 32 of a malleable conductive material secured to its upper and lower surface. Portions 32 extend slightly from the surface of wafer 26. Islands 30 are electrically isolated from each other by the dielectric material and by the ground plane conductive material of the wafer 26 between the openings. Portions 34 of malleable conductive material are also secured to the upper and lower surfaces of the conductive material of wafer 26. Connecting wafer 26, and a method for the manufacture thereof, are shown and described in greater detail in the before mentioned Parks application.

The pattern and spacing of islands 30 and portions 32 is identical to the pattern and spacing of the portions 22 which project through wafer 16, and, when the two wafers are properly positioned adjacent each other, each portion 22 is in physical and electrical contact with a mating portion 32. Portions 34 are in contact with the ground-carrying conductive material of inter-connect wafer 16 and serve to carry the ground plane to the conductive material of wafer 26.

The connector assembly is completed by a strain relief boot 38 which is slipped or molded into place to prevent bending or over stressing in the joint area and by a connector frame or body 40. Frame 40 has a recess 42 in which is positioned a resilient pressure pad 44. The function of pressure pad 44 will be described shortly. Frame 40 has a rear extension 46 with ribs 48 which are adapted to fit into shallow grooves 50 between wafer 16 and wafer 26 to secure the wafers in the frame. A spring pin 52 passes through an opening in each side of frame 40. As may be seen best in FIG. 2, the connector assembly is adapted to be mated to a substrate or board 54 having a pattern of conductive portions 55 formed thereon by forcing the spring pins through mating openings in the board. This arrangement provides for snap action attachment and also permits removal of the connector by use of a small tool such as a screw driver. In order for pins 52 to snap into position, sufficient pressure must be applied to the connector to compress pressure pad 44. Pad 44 remains compressed when spring pins 52 lock the connector in position causing a uniformly distributed pressure or force to be applied to the wafers 16 and 26. This results in deformation of the malleable conductive portions 32 and 34 which assures good electrical connection within the connector. Good electrical connection is also provided between the conductive portions 32 and 34 on the underside of wafer 26 and conductive portions 55 on board 54. In addition to assuring uniform pressure distribution, pressure pad 44 also serves to compensate for slight dimensional variations in the connector components.

A connector has thus been provided which maintains a ground plane about the signal conductor on at least three sides from the cable, through the inter-connect wafer 16 and the connect wafer 26, to the circuit board 54. Cross-talk and other noise problems are thus maintained at a minimum, permitting optimum speed and bandwidth operation. Even though segments 18 are surrounded on only three sides by conductive ground-plane material, substantial isolation may be maintained by making troughs 23 in which the segments are positioned deep enough. If base 44 is of a conductive material, ground plane on four sides is provided, resulting in complete isolation of segments 18. It is also seen that the geometry of the connector is substantially identical to the geometry of the tape cable and boards and it is therefore a relatively simple matter to provide for impedance match in the connector. The carrying of the ground plane through the connector also significantly enhances the impedance match. Since the connect and inter-connect wafers are manufactured using precision chemical metal etching technology, the impedances of these elements may be controlled within fine tolerances. These elements may also be batch fabricated at relatively low cost. A relatively inexpensive and easy to assembly connector is thus provided.

Figure 5:
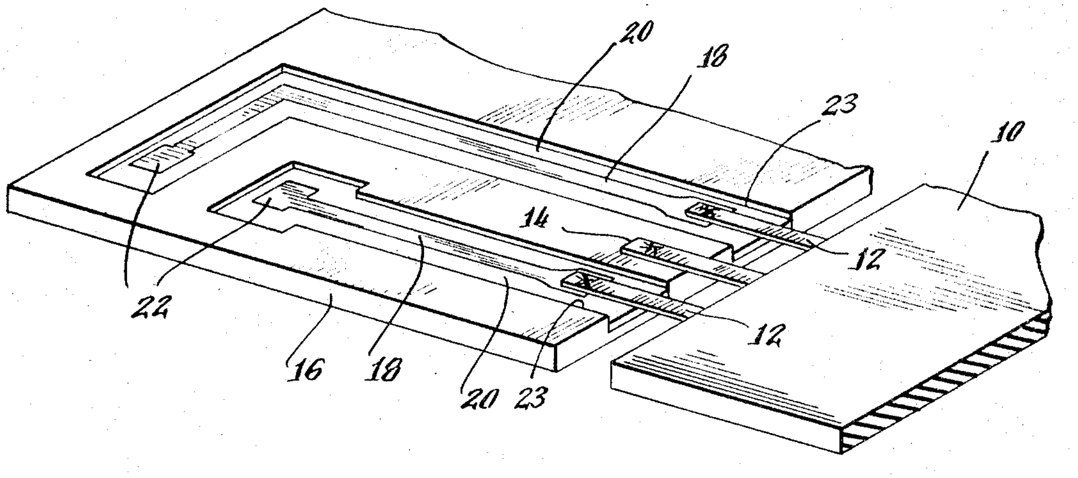
Figure 6:
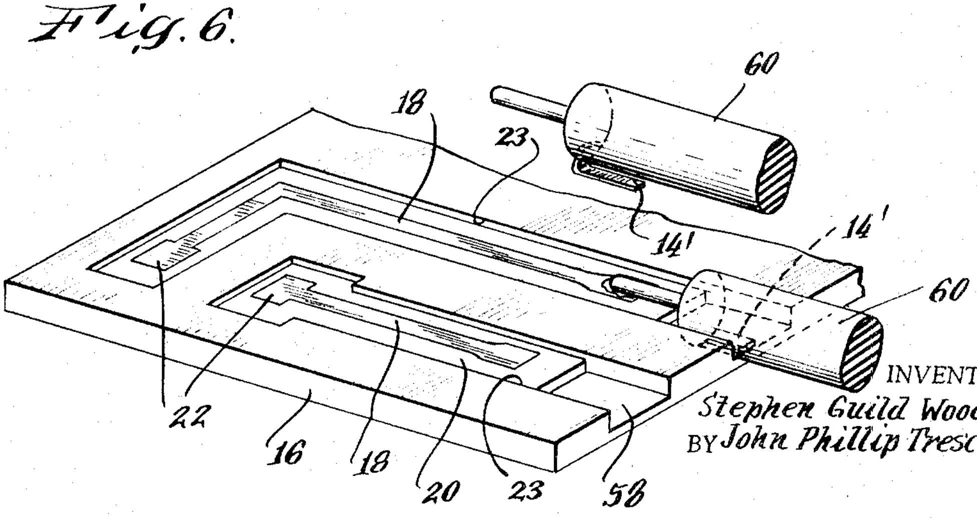

While for illustrative purposes, the cable 10 shown in FIGS. 1, 2 and 4 has had a single ground plane conductor on the under side of the cable, the connector of this invention is also suitable for use with other types of cable. For example, FIG. 5 shows the manner in which a cable 10 having alternate signal conductors 12 and ground conductors 14 would be connected to an inter-connect wafer 16 which is substantially the same as the inter-connect wafer 16 of FIG. 4. In FIG. 5, it is seen that signal lines 12 are connected to conducting segments 18 in a manner identical to that shown in FIG. 4 while each ground conductor 14 is connected by spot weld or other suitable techniques to conductive material of wafer 16 between two segments. FIG. 6 shows the manner in which a cable having ground tails 14 (drain wires) is connected to wafer 16. For this embodiment of the invention, conducting segments 18 and dielectric material 20 are recessed slightly from the edge of the wafer leaving a ground-plane trough 58 in which the dielectric sleeve 60 is fitted. The ground wire 14 is bent back so as to be wedged between dielectric 60 and the underside of trough 58. This wire may be welded or soldered to the conductive material of the wafer. It is also possible that the line 10 will be made up of a plurality of semi-rigid coaxial cables each of which has a conductive outer sleeve. These cables may be connected as shown in FIG. 6 with the outer sleeve resting directly in trough 58. When the dielectric of the cable is too thick for this arrangement to work, an arrangement such as that shown in FIGS. 9 and 10 to be described later may be utilized.

Figure 7:
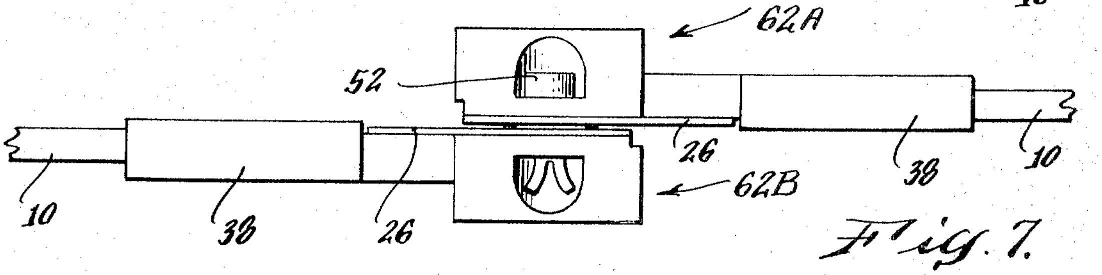
FIG. 7 is a side view illustrating a cable-to-cable connection utilizing the teachings of this invention.

Referring now to FIG. 7, it is seen that the teachings of this invention may be utilized to connect two cables of either similar or dissimilar configuration as well as for connecting a cable to a board. Each of the connector assemblies 62 is substantially identical to the connector assembly 62 shown in FIG. 2 except that assembly 62B has openings for receiving pins 52 rather than having pins. A preferred arrangement would be for each assembly 52 to have one pin and one opening resulting in a universal cable connector.

Figure 8:
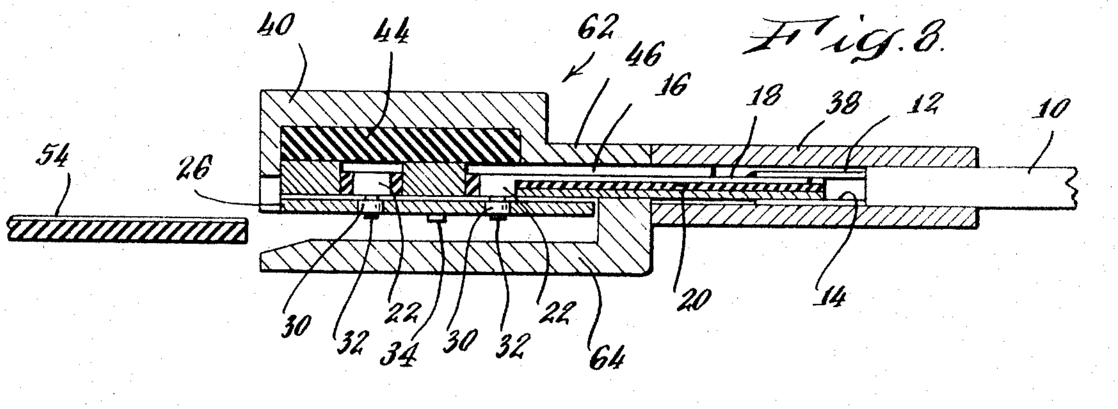
FIG. 8 is a side view of an edge-type connector embodiment of the invention.

FIG. 8 illustrates another way in which a board 54 may be secured to the connector assembly 62 of this invention. In FIG. 8, connector frame 40 has a lower jaw 64 which forms one wall of a slot, the upper wall of which is connecting wafer 26. The distance between jaw 64 and wafer 26 is normally less than the thickness of board 54 so that insertion of the board into the slot results in pressure pad 44 being compressed. This applies mechanical pressure to board 54 to hold it in the connector and also causes deformation of the malleable segments 32 and 34 to assure good electrical contact between the two wafers and between connecting wafer 26 and the board.

Figure 9:
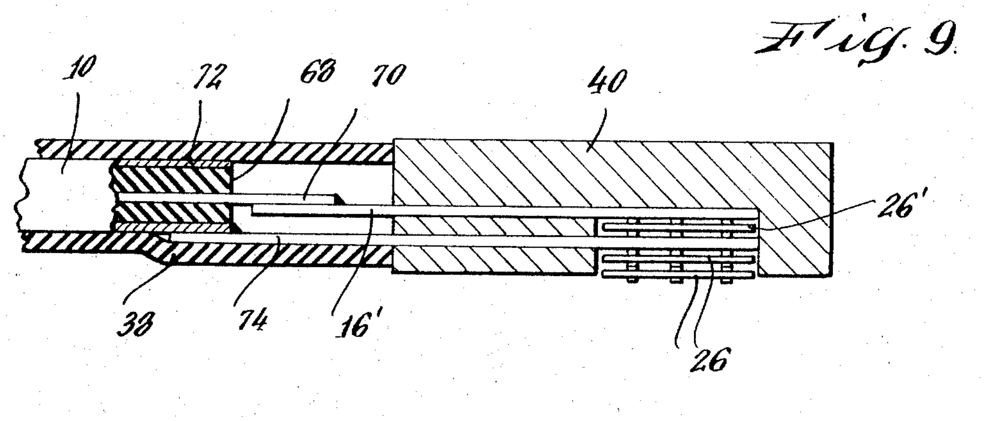
FIG. 9 is a cut-away side view of an embodiment of the invention having multiple connect and inner-connect wafers and solder joints.

Referring now to FIG. 9, the input cable 10 is a semi-rigid coaxial cable with a dielectric 68 between its inner conductor 70 and its outer ground sleeve 72 which is too thick to be fitted in the trough 58 (FIG. 6). A more complex arrangement is thus required. In FIG. 9, center conductor 70 is soldered to an inter-connect wafer 16 which is substantially identical to the wafer 16 shown in FIG. 1. Ground conductor 72 is soldered to an inter-connect wafer 74 which may be a wafer of conductive material with a pattern of Z-axis conductive islands passing through it matching the pattern of the Z-axis segments 22 of wafer 16. Positioned between wafer 16 and wafer 74 is a connecting wafer 26 which may be identical to the connecting wafer 26 of FIG. 1. However, since ground connections are not being made to wafer 16, the ground conducting malleable portions 34 may be eliminated from the wafer 26 if desired. Because of mechanical spacing considerations, two connecting wafers 26 have been shown between ground-plane connecting wafer 74 and the element to which connection is to be made. As was indicated in the before-mentioned Parks application, any number of connecting wafers may be stacked to make Z-axis connection where the relative size of components makes such stacking necessary. Ground potential is carried through the stack by malleable segments 34 and signal is carried through the stack by malleable segments 32 and the attached conductive islands 30. The remaining elements of the connector are substantially the same as those previously described and the connector would be secured to a circuit board or to a like connector for another cable in manners previously described.

Figure 10:
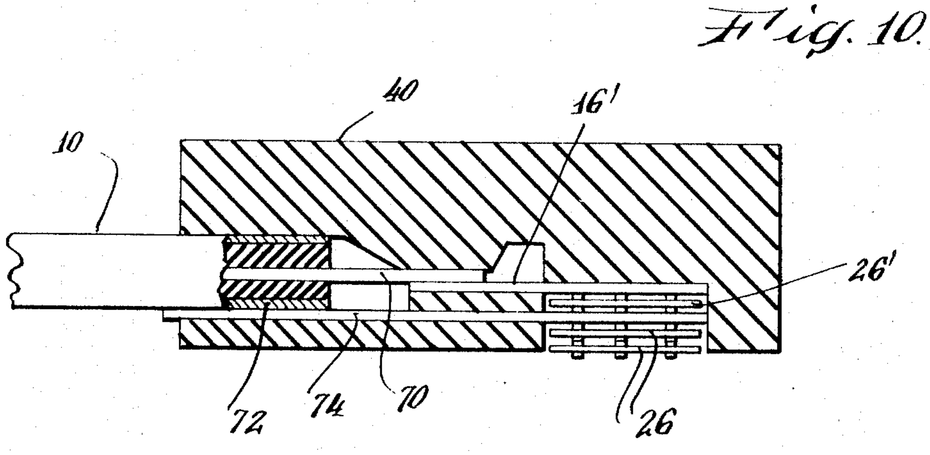
FIG. 10 is a cut-away side view of an embodiment of the invention having multiple connect and inner-connect wafers and clamped joints.

FIG. 10 shows a connector which is substantially identical to that shown in FIG. 9 except that conductors 70 and 72 are clamped to circuit boards 16 and 74 respectively rather than being soldered to these elements. Clamp pressure may be applied by a screw, clip, or other suitable means.

Figure 11:
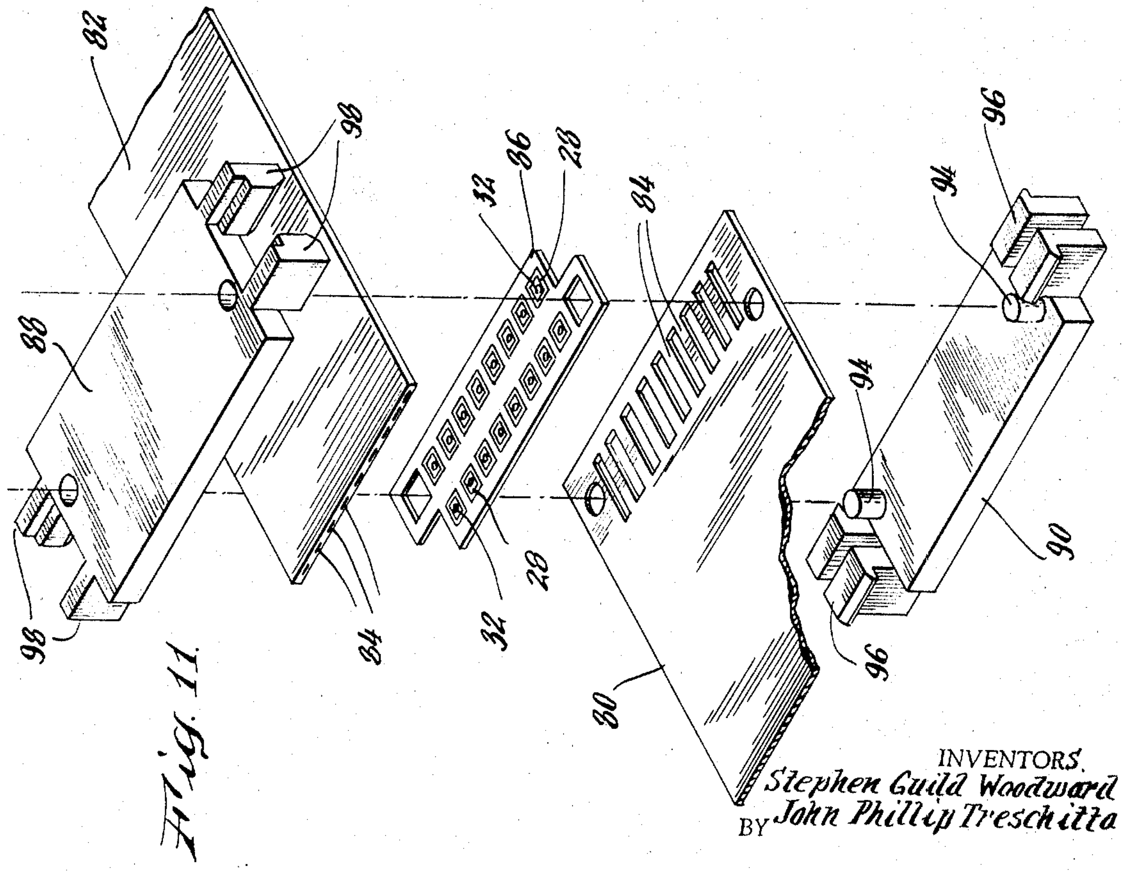
FIG. 11 is an exploded perspective view of a simplified embodiment of the invention for connecting two non-grounded cables.

In all of the embodiments of the invention described so far, the input line 10 has had a ground conductor which is to be carried through the connector and impedance match characteristics have been important. However, it is possible to utilize some of the teachings of this invention in simpler applications where the input line does not have a ground conductor and impedance match characteristics of the connector are not critical. In FIG. 11, a connector is shown for two cables, 80 and 82, each of which has only signal conductors 84. For each cable, insulation is stripped away as shown for cable 80 in the area of the connector and a connecting wafer 86, which is substantially identical to connecting wafer 26 except that ground conducting portions 34 have been eliminated, is positioned over the exposed portion of one of the cables with malleable segments 32 thereof positioned over the conductors 84. For the embodiment of the invention shown in FIG. 11, two segments 32 are positioned over each conductor 84. The second cable 82 is then positioned over the wafer 86 with its conductors properly positioned over the portions 32 and the assembly is clamped between two housing members 88 and 90. Housing member 90 has two guide pins 94 which may be utilized to align the elements and a pair of spring clips 96 which mate with clip elements 98 on housing member 88 to hold the assembly together. The spacing between the members 88 and 90 when the clip is closed is sufficiently small to cause pressure to be applied to malleable portions 32 assuring good electrical contact. In practice, cable 80 and wafer 86 might be preassembled in housing member 90 with this assembly then being field connected to a cable 82 by simply stripping the cable and snapping housing 88 in place over it.

Figure 12:
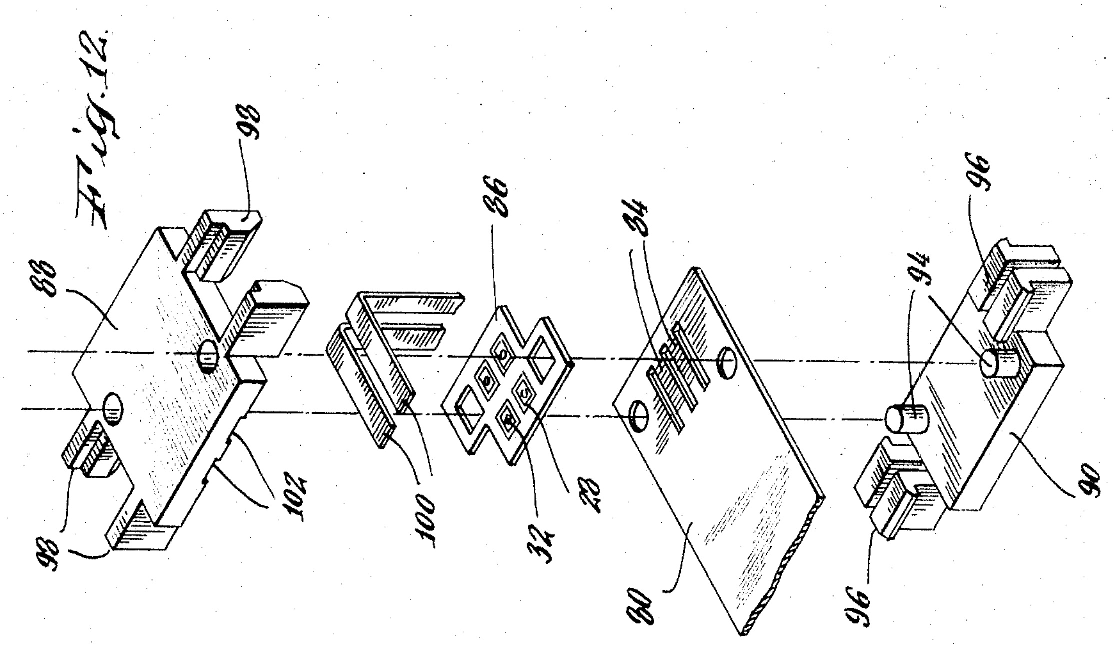
FIG. 12 is an exploded perspective view of a simplified embodiment of the invention for connecting a non-grounded cable to tabs or fingers of another circuit element.

FIG. 12 shows an embodiment of the invention which is substantially identical to that shown in FIG. 11 except that conducting prongs 100 from a circuit board or other electrical component have been substituted for the tape cable 82. Recesses 102 are provided in housing member 88 to assure proper alignment of pins 100 in the connector. A pressure pad may be affixed to base member 90 between guide pins 94 for the embodiments shown in FIGS. 11 and 12 if greater pressure is required for improved electrical contact. Circular rather than flat conductors might also be utilized with these embodiments of the invention.

Figure 13:
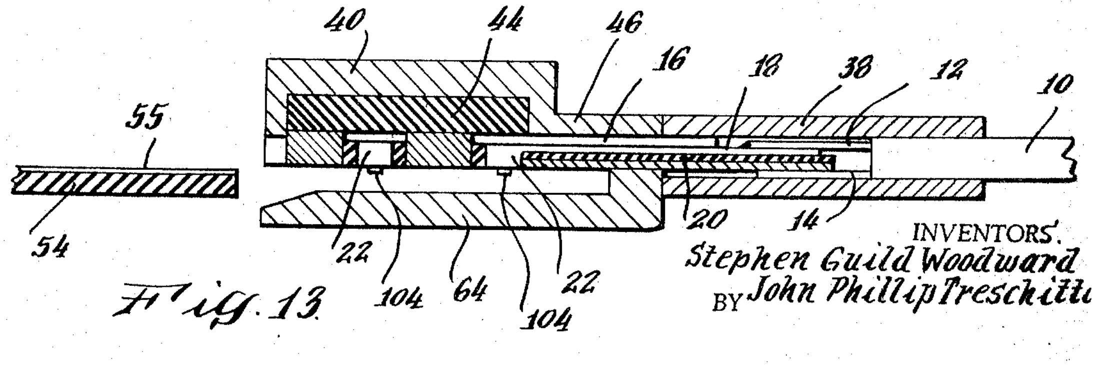
FIG. 13 is a side sectional view of another alternative embodiment of the invention.

Referring now to FIG. 13, another possible embodiment of the invention is shown. For this embodiment of the invention, connecting wafer 26 has been eliminated and malleable projections 104 have been provided on the underside of each of the portions 22 of segments 18. The malleable portions 104 function in the same manner as the malleable portions 32 to make electrical contact with conductive portions 55 of board 54. It is thus seen that in connector applications where the Z-axis spacing provided by the connecting wafers 26 is not required, the connecting wafers may be dispensed with provided malleable portions are added to the segments 18.

In the discussion above, the dielectric material surrounding the conductive island in the wafers 26 has been shown as going all the way through the wafer. The dielectric material, however, is required only to provide mechanical support and electrical isolation and need be only thick enough to perform these functions. Segments 18 of wafer 16 have also been shown as being parallel to each other at the end where they are connected to the leads 12 of cable 10. It should, however, be noted that the configuration of these segments, both at the end making contact with the cable and and at the end formed into portions 22, is primarily dependent on the structure of the cable leads and the pattern of conductive portions 55 and that the shape of these segments may thus vary substantially while still remaining within the teachings of the invention. It should also be noted that, while in the discussion above, the wafers 16 and 26 have been considered to be of the type shown in the before mentioned Parks application, other wafer structures capable of performing the required function might be utilized. For example, a single pin extending through the wafer and projecting slightly beyond the wafer surface at each end might be substituted for the conductive islands 30 and malleable portions 32. The wafers must, however, have electrically isolated conductive islands surrounded by areas of conductive material.

Thus, while preferred embodiments of the invention have been described above, it is to be understood that the foregoing and other changes in form and details may be made therein by those skilled in the art without changing the spirit and scope of the invention.

What is claimed is:

1. A device for physically and electrically connecting a multi-conductor electrical line to an element having electrically conductive portions comprising;

a connecting wafer of electrically conductive material having an upper and a lower surface, a plurality of dielectric filled openings extending between said surfaces, an island of electrically conductive material positioned in each of said openings, said islands projecting slightly from each of said surfaces and being electrically isolated from the conducting material of the wafer and from each other by said dielectric material, there being at least one opening, and thus conductive island, for each of at least selected ones of the conductors of said line;

an interconnecting wafer of electrically conductive material having a predetermined pattern of electrically conductive segments formed thereon, each of said segments having a first and a second end, there being a segment on said interconnecting wafer for each of said at least selected ones of the conductors of said line, said interconnecting wafer including means for electrically isolating each of said segments from the conducting material of said interconnecting wafer and from each other, each of said segments extending through said interconnecting wafer at the first end thereof;

means for physically and electrically connecting each of said at least selected ones of the conductors of said line to a corresponding segment at the second end of said segment;

means for supporting said wafers in a position with each of the ends of said segments which extend through the inter-connect wafer in electrical contact with an island of electrically conductive material on one of the surfaces of said connecting wafer; and means for securing said wafers, under pressure, to said element with the projecting portions of the islands of electrically conductive material on the other surface of said connecting wafer in electrical contact with conductive portions of said element.

2. A device of the type described in claim 1 wherein there is at least one ground conductor in said line, said ground conductor not being a said selected one of the conductors; and including means for electrically connecting said ground conductor to the conductive material of said connecting wafer.

3. A device of the type described in claim 2 wherein said ground conductor connecting means includes means for connecting said ground line to the conductive material of said interconnecting wafer; and means for connecting and conducting material of said interconnecting wafer to the conducting material of said connecting wafer, whereby the conducting material of both wafers are placed at ground potential.

4. A device of the type described in claim 3 wherein the portion of each conductive island which projects above the surface of the connecting wafer is a portion of malleable conductive material secured in electrical contact with the island; and wherein the conducting material connecting means includes at least one portion of malleable electrically conductive material secured to the conductive material of the surface of the connecting wafer adjacent to the interconnecting wafer, said portion being oriented so as to make contact with the conductive material of the interconnecting wafer when said wafers are supported together.

5. A device of the type described in claim 3 wherein the adjacent conductors of said line alternate between signal and ground conductors, the selected ones of said conductors being the signal conductors; and wherein said means for connecting the ground conductor includes means for connecting each ground conductor to conductive material of said interconnecting wafer between the segments to which two adjacent signal conductors are attached.

6. A device of the type described in claim 3 wherein the adjacent conductors of said line are signal conductors with a ground conductor being provided along one side of said line, the selected ones of said conductors being the signal conductors;

and wherein said means for connecting the ground conductor includes means for connecting said ground conductor to conductive material on the corresponding side of said inter-connecting wafer.

7. A device of the type described in claim 3 wherein the adjacent conductors of said line are signal conductors with a ground wire being provided adjacent to, but electrically isolated from, each signal conductor;

and wherein said means for connecting the ground conductor includes a trough formed in said interconnecting wafer extending from each of said segments, said ground wire being bent back under said signal conductor and electrically connected to the bottom of said trough.

8. A device of the type described in claim 2 wherein the adjacent conductors of said line are coaxial cables having a center signal conductor and an outer ground conductor which conductors are separated from each other by an insulating sleeve; and wherein said ground conductor connecting means includes means for connecting said outer conductor to the conducting material of an interconnecting wafer.

9. A device of the type described in claim 8 wherein said center conductor and said outer conductor are connected to different interconnecting wafers; and one or more connecting wafers for connecting said interconnecting wafers to the connecting wafer in electrical contact with the conductive portions of said element.

10. A device of the type described in claim 1 wherein said conductor-to-segment connecting means is solder joint.

11. A device of the type described in claim 1 wherein said conductor-to-segment connecting means is a weld joint.

12. A device of the type described in claim 1 wherein said conductor-to-segment connecting means is a mechanical joint.

13. A device of the type described in claim 1 wherein said element is a second multi-conductor electrical line, said electrically conductive portions being projecting portions of conductive islands of a connecting wafer of a mating connecting device.

14. A device of the type described in claim 1 wherein the portion of each conductive island which projects above the surface of the connecting wafer is a portion of malleable conductive material secured in electrical contact with the island.

15. A device of the type described in claim 1 wherein each of said islands is supported in said connecting wafer and substantially surrounded by dielectric material.

16. A device of the type described in claim 1 wherein the segments of said interconnecting wafer are parallel to each other at said second end.

17. A device of the type described in claim 1 wherein each segment of said interconnecting wafer is in a trough formed in said wafer.

18. A device of the type described in claim 17 wherein said segments are substantially surrounded on three sides by dielectric material which electrically isolates each segment from the conducting material forming the trough.

19. A device of the type described in claim 17 including a frame member of electrically conductive material positioned in part over said troughs, whereby each of said segments has ground plane shielding of all sides.

20. A device of the type described in claim 1 including a strain relief boot secured in position over the connection between the conductors of said line and the segments of said interconnecting wafer.

21. A device of the type described in claim 1 including a frame member in which said wafers are supported, said frame member having means, included as part of said securing means, for mechanically securing said device to said element.

22. A device of the type described in claim 21 wherein said securing means includes one or more spring pins passing through the frame member and adapted to coact with mating holes in said element.

23. A device of the type described in claim 21 wherein said element is a board-like member having a given thickness; and wherein said securing means includes a lower jaw on said frame member which is substantially parallel to the underside of said connecting wafer and spaced therefrom by a distance slightly less than the thickness of said board-like member, said jaw and wafer forming a slot which is adapted to receive said board-like member.

24. A device of the type described in claim 21 including a pressure pad secured in said frame member over said wafers, said pressure pad being adapted to apply a uniformly distributed pressure to said wafers when said wafers are secured to said element.

25. A device of the type described in claim 21 including means for applying a uniformly distributed pressure to said wafers when said wafers are secured to said element.

26. A device for physically and electrically connecting a multi-conductor electrical line to an element having electrically conductive portions comprising:

a connecting wafer having an upper and a lower surface and a plurality of islands of electrically conductive material, dielectric material being disposed around each of said islands to electrically isolate the islands from each other, said islands projecting slightly from each of said surfaces and there being at least one conductive island for each conductor of said line;

means for maintaining each conductor of said line in electrical contact with at least one of the projecting island portions on one of the surfaces of said wafer;

means for securing said connecting wafer to said element with the projecting island portions on the other surface of said wafer in electrical contact with conductive portions of said element; and means, including at least in part said securing means, for applying pressure in a direction to urge said conductors and said element against said wafer.

27. A device of the type described in claim 26 wherein said element is a second multi-conductor electrical line, said electrically conductive portions being the conductors of said second line.

28. A device of the type described in claim 26 wherein said element is an electrical component, said electrically conductive portions being prongs projecting from said component.

29. A device of the type described in claim 26 wherein the portion of each conductive island which projects above the surface of the connecting wafer is a portion of malleable conductive material secured in electrical contact with the island.

30. A device of the type described in claim 26 wherein said means for maintaining each conductor of said line in electrical contact with the projecting island portions includes an interconnecting wafer of electrically conductive material having a predetermined pattern of electrically conductive segments formed thereon, each of said segments having a first and a second end, there being a segment on said wafer for each of said at least selected one of the conductors of said line, said wafer including means for electrically isolating each of said segments from the conducting material of said wafer and from each other, each of said segments extending through said wafer at the first end thereof; and means for physically and electrically connecting each of said at least selected ones of the conductors of said line to a corresponding segment at the second end of said segment.

31. A device for physically and electrically connecting a multi-conductor electrical line having predetermined geometry to an element having electrically conductive portions arranged in a predetermined geometry comprising:

segment means connected to conductors of said line at one end, said segment means being oriented in the geometry of said line at said one end and in the geometry of said portions at the other end;

means for providing ground-plane shielding for said segments along substantially their entire length;

means secured to said other end of the segment means and adapted when said device is secured to the element to electrically connect said segment means to the conductive portions of said element; and means for securing the device to the element.

32. A device of the type described in claim 31 wherein said means for electrically connecting the segments to the device includes a portion of a malleable conductive material secured in electrical contact with the other end of said segment means.

33. A device of the type described in claim 31 wherein said means for electrically connecting the segments to the device includes a connecting wafer of electrically conductive material having an upper and a lower surface, a plurality of dielectric filled openings extending between said surfaces, an island of electrically conductive material positioned in each of said openings, said islands projecting slightly from each of said surfaces and being electrically isolated from the conducting material of the wafer and from each other by said dielectric material, there being at least one opening, and thus conductive island, for each of at least selected ones of the conductors of said line.

* * * * *